(12) United States Patent
Koelle et al.

(10) Patent No.: US 7,615,987 B2
(45) Date of Patent: Nov. 10, 2009

(54) DEVICE FOR DETERMINING ELECTRICAL VARIABLES

(75) Inventors: Gerhard Koelle, Wiernsheim (DE); Stephan Mazingue-Desailly, Ludwigsburg (DE); Alexander Lerich, Schwieberdingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/663,719

(22) PCT Filed: Sep. 27, 2005

(86) PCT No.: PCT/EP2005/054839

§ 371 (c)(1),
(2), (4) Date: Sep. 4, 2007

(87) PCT Pub. No.: WO2006/035025

PCT Pub. Date: Apr. 6, 2006

(65) Prior Publication Data

US 2008/0088300 A1 Apr. 17, 2008

(30) Foreign Application Priority Data

Sep. 30, 2004 (DE) .................. 10 2004 049 251

(51) Int. Cl.
*G01R 1/20* (2006.01)

(52) U.S. Cl. .................................................. 324/126
(58) Field of Classification Search .................. None
See application file for complete search history.

(56) References Cited

U.S. PATENT DOCUMENTS

| 3,471,784 | A | * | 10/1969 | Arndt et al. | 324/126 |
| 4,584,525 | A | * | 4/1986 | Harnden et al. | 324/126 |
| 5,083,081 | A | * | 1/1992 | Barrault et al. | 324/126 |
| 5,107,202 | A | * | 4/1992 | Renda | 324/96 |
| 6,218,805 | B1 | | 4/2001 | Melcher | |

FOREIGN PATENT DOCUMENTS

| DE | 197 36 025 | 3/1999 |
| DE | 199 61 311 | 7/2001 |
| DE | 103 32 410 | 7/2003 |
| DE | 203 18 266 | 2/2004 |
| WO | WO 99/54744 | 10/1999 |

\* cited by examiner

*Primary Examiner*—Ha Nguyen
(74) *Attorney, Agent, or Firm*—Kenyon & Kenyon LLP

(57) ABSTRACT

A device for determining electrical variables, having a housing and an electrical main conductor, which is provided for conducting a load current, and which has a measuring section, having an electrical evaluation unit which is connected to the electrical main conductor in an electrically conductive manner, the measuring section being directly sealed and held by the housing, which is developed as an injection molded housing.

5 Claims, 1 Drawing Sheet

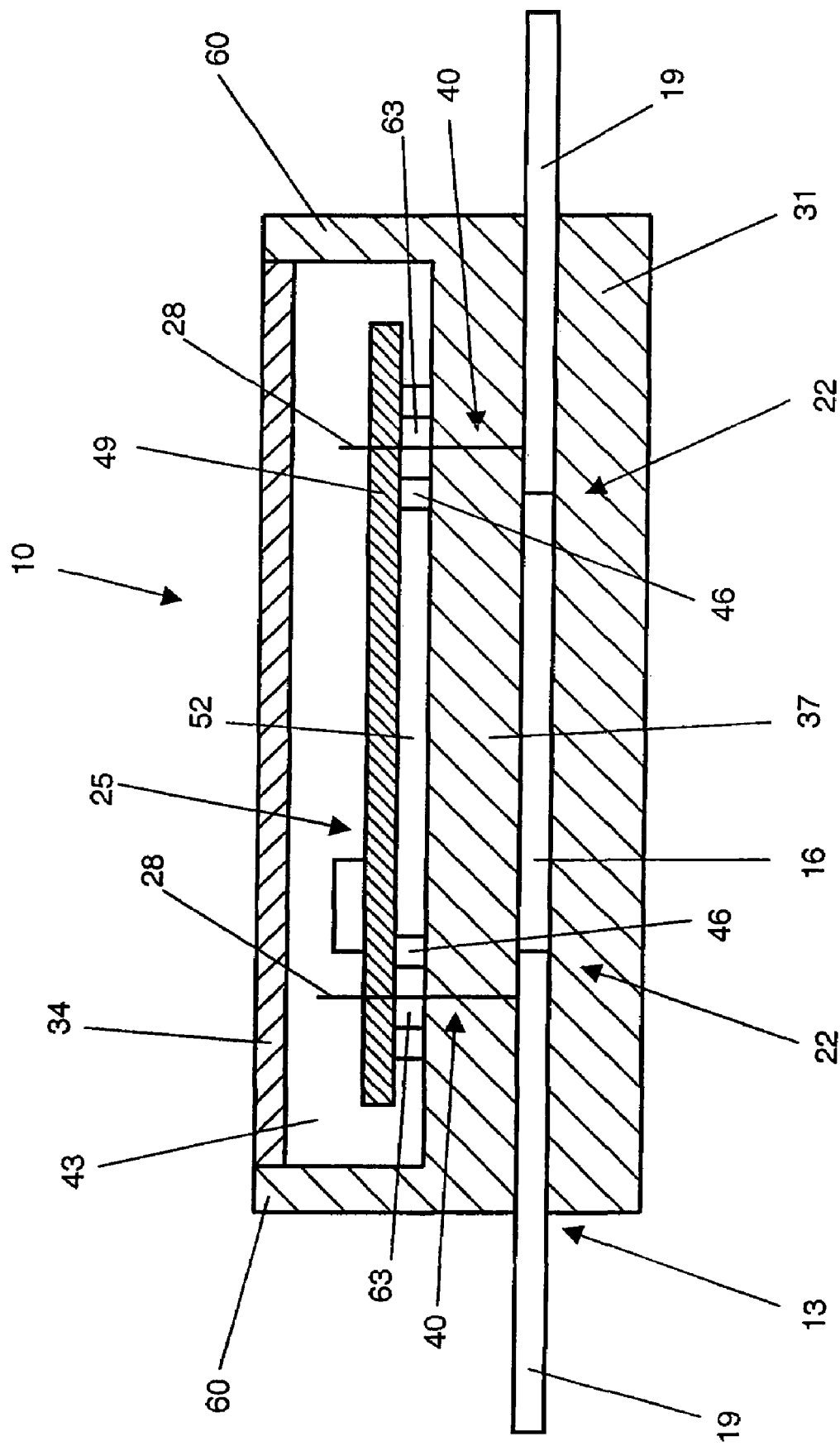

DEVICE FOR DETERMINING ELECTRICAL VARIABLES

BACKGROUND INFORMATION

A device is described in German Patent Application No. DE 199 61 311, in which the electrical evaluation unit is brought very tightly to the electrical main conductor. This reduces the possibility of coupling in of interference signals. A printed circuit board is soldered to the main conductor with the evaluation unit, between the evaluation unit and the main conductor, via the connecting leads. In order to ensure a good seal against penetrating dampness, this arrangement is extrusion-coated with a plastic material. In this embodiment, it is a disadvantage that first, the expansion coefficients of main conductor and printed circuit board are very different, and consequently, when there are temperature changes and changes in length generated thereby, undesired mechanical stresses may appear between the main conductor and the printed circuit board of the evaluation unit.

SUMMARY OF THE INVENTION

The device according to the present invention for determining electrical variables has the advantage that the measuring section of the main conductor, because of the injection molded housing, on the one hand is completely and directly sealed and held, and on the other hand, the sealing effect is independent of differences of mechanical stresses between the main conductor and the evaluation unit. The sealing effect of the injection molded housing is also ensured reliably over a longer time period, because these mechanical stress differences do not occur. As a side effect, one may expect a prolonged service life of the evaluation unit, since it is also exposed to no, or almost no mechanical stresses that are generated and forced by the main conductor.

If one or more connecting conductors are situated between the main conductor and the evaluation unit, and if these are penetrated by a separating wall, situated between the main conductor and the evaluation unit, of the injection molded housing, this ensures that it is avoided that bigger joints or gaps that cannot be managed by injection molding technique come about, in response to preassembled connecting conductors and subsequent injection of the injection molded housing. The sealing of the device, especially from the main conductor, is ensured particularly well in this way.

In order for the main conductor to be securely sealed, and is consequently not exposed to corrosive influences, it is provided that the joint between the separating wall and the at least one connecting conductor is tight. This can be achieved, for example, by having the injection molding compound seals around the connecting conductor.

Alternatively, a seal between the separating wall and the evaluation unit, and thus finally the main conductor as well, can be achieved by placing sealing means between the evaluation unit and the separating wall.

It is provided that the separating wall separate the main conductor from a space in which the evaluation unit is situated. Consequently, in this device there come about at least two spaces that are functionally separated, and which therefore influence each other as little as possible. The first space is the space that is completely filled by the main conductor, and the second space is the space in which the evaluation unit is situated.

Finally, it is provided that the space in which the evaluation unit is situated is closed by a cover.

BRIEF DESCRIPTION OF THE DRAWING

The FIGURE shows a sectional view of a device according to the present invention, for determining electrical variables.

DETAILED DESCRIPTION

The FIGURE shows a longitudinal section through device 10 according to the present invention. Device 10 has an electrical main conductor 13, which is a flat strip in this example. Main conductor 13 can be subdivided into three sections. The first section is so-called measuring strip 16, which in this case is situated, for example, in the middle of electrical main conductor 13. On each side of measuring section 16, a connecting area 19 is present. Measuring section 16 is usually made of a special alloy, such as manganin, which has favorable properties for current sensors. Terminal areas 19, in turn, may, for instance, be made of copper. The two terminal areas 19 and measuring section 16 are connected by a welding connection at each joint 22, between a terminal area 19 and measuring section 16. This electrical main conductor 13 is provided for conducting a load current. To do this, left terminal area 19 is connected at least indirectly to a pole of an electrical supply device. By contrast, terminal area 19, that is on the right in the FIGURE, is connected to electrical users. Along with the conducting of the load current, there is a change in the properties of measuring section 16, which is ascertained by an electrical evaluation unit 25. In the example, electrical evaluation unit 25 is connected for this purpose by circuit technology to main conductor 13, using at least two connecting conductors 28. It is provided that connecting conductors 28 accommodate measuring section 16 between them in circuit technology. There may be further connecting lines 28 between electrical main conductor 13 and evaluation unit 25, but these are not shown here. A housing 31 contains both electrical main conductor 13 and evaluation unit 25, and is closed with the aid of a cover 34.

For a support of main conductor 13 in the housing that is as tight as possible, it is provided here that measuring section 16 is sealed and held directly by housing 31 that is developed as an injection molded housing.

Thus, a device 10 is provided for determining electrical variables which has a housing 31 and an electrical main conductor 13, this main conductor being provided for conducting a load current. Main conductor 13 has a measuring section 16. Electrical evaluation unit 25 is conductively connected to electrical main conductor 13. Measuring section 16 is directly sealed and held by housing 31, which is developed as an injection molded housing.

Housing 31 has a separating wall 37 which is situated between electrical main conductor 13 and evaluation unit 25. Connecting conductors 28 penetrate through separating wall 37.

Because connecting conductors 28 penetrate through separating wall 37, there is a joint 40 at this place. In order that, between a space 43, in which evaluation unit 25 is accommodated, and electrical main conductor 13 no dampness can be transported, it is provided that a) joint 40 between separating wall 37 and the at least one connecting conductor 28 is tight, and/or b) joint 40 between separating wall 37 and the at least one connecting conductor 28 is sealed by sealing means 46 between separating wall 37 and evaluation unit 25. This may, for instance, be implemented in that evaluation unit 25 has a printed circuit board 49 on one side and that there is a gap 52 between printed circuit board 49 and separating wall 37. Since connecting conductors 28 are connected by a mechanically tight connection to printed circuit board 49, a mechanically tight gap 40 can be achieved by sealing means 46 situated around connecting conductors 28.

In the example, housing 31 is designed in such a way that walls 60 extend, on the side of separating wall 37 facing away from main conductor 13. These walls 60 form space 43, and point in the direction facing away from main conductor 13. Space 43, enclosed round about by walls 60, is closed by cover 34.

A plastic is provided as the material for housing 31 and also for cover 34. Connecting conductors 28 extend perpendicularly from electrical main conductor 13, and are able to be soldered to main conductor 13 or welded to it. Alternatively, it is also possible to press connecting conductors 28 into corresponding bores in main conductor 13.

It is not only possible to make up connecting conductors 28 from individual wire connections. Rather, by reshaping terminal areas 19, one may also make possible electrical connections to evaluation unit 25. By using an appropriate punched or punched bent part it would also be possible to make a connection to evaluation unit 25.

Evaluation unit 25 is supported on several platforms 63, which are, for instance, made in one piece with separating wall 37. In this context, the platforms also surround the connecting conductors or at least a part of connecting conductors 28.

In response to a suitable embodiment of connecting conductors 28, they are able to represent not only the electrical connection between main conductor 13 and evaluation unit 25, but at the same time also the mechanical fastening of evaluation unit 25 in housing 31. The mechanical fastening of evaluation unit 25 can, however, also just be supported by connecting conductors 28, since other fastening means can be present.

For the evaluation of the electrical voltage in measuring section 16, it is provided that at least two of connecting conductors 28 be used for this. For this, one would have to provide one connecting conductor 28 in the area of each joint 22. To do this, connecting conductor 28 would not necessarily have to be situated in terminal area 19, but rather, such a connecting conductor 28 could also be positioned on measuring section 16.

The connection of connecting conductors 28 to evaluation unit 25 can be carried out in various ways. Thus, connecting conductors 28 may, for instance, be pressed or soldered into appropriate recesses in printed circuit board 49. Alternatively, connecting conductors 28 can also be soldered onto appropriate contact surfaces that are not shown here, or be connected by adhesion in an electrically conductive manner.

The invention claimed is:

1. A device for determining electrical variables, comprising:
    an injection molded housing;
    an electrical main conductor for conducting a load current, the electrical main conductor having a measuring section, the measuring section being directly sealed and held by the housing;
    an electrical evaluation unit connected to the electrical main conductor in an electrically conductive manner; and
    at least two connecting conductors electrically connecting the main conductor to the evaluation unit and penetrating through a separating wall of the injection molded housing situated between the main conductor and the evaluation unit;
    wherein the injection molded housing contains both the electrical main conductor and the evaluation unit.

2. The device according to claim 1, further comprising a tight joint between the separating wall and the at least two connecting conductors.

3. The device according to claim 1, further comprising:
    a joint between the separating wall and at least one connecting conductor, wherein the joint is sealed by a sealing agent between the separating wall and the evaluation unit.

4. The device according to claim 1, wherein the separating wall separates the main conductor from a space in which the evaluation unit is situated.

5. The device according to claim 4, wherein the space is closed by a cover.

* * * * *